(12) United States Patent
Yamamoto et al.

(10) Patent No.: US 6,359,318 B1
(45) Date of Patent: Mar. 19, 2002

(54) SEMICONDUCTOR DEVICE WITH DMOS AND BI-POLAR TRANSISTORS

(75) Inventors: Fumitoshi Yamamoto; Tomohide Terashima, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/258,401

(22) Filed: Feb. 26, 1999

(30) Foreign Application Priority Data

Sep. 3, 1998 (JP) .......................... 10-249798

(51) Int. Cl.[7] .................... H01L 29/76; H01L 29/94; H01L 31/062; H01L 31/113; H01L 31/119
(52) U.S. Cl. .................. 257/378; 257/370; 257/339; 257/341; 257/342; 257/413
(58) Field of Search ................. 257/370, 378, 257/339, 341, 342, 337, 412, 413; 438/268

(56) References Cited

U.S. PATENT DOCUMENTS

| | | | |
|---|---|---|---|
| 5,317,180 A | 5/1994 | Hutter et al. | ................ 257/378 |
| 5,751,054 A | 5/1998 | Yilmaz et al. | ................ 257/378 |
| 5,767,558 A * | 6/1998 | Lo et al. | ...................... 257/412 |
| 5,981,983 A * | 11/1999 | Funaki et al. | ................ 257/341 |
| 6,022,778 A * | 2/2000 | Contiero et al. | ............ 438/268 |

FOREIGN PATENT DOCUMENTS

| | | | |
|---|---|---|---|
| EP | 0731504 A1 | 3/1995 | ................. 257/378 |
| JP | 8-321556 | 12/1996 | ................. 257/378 |

* cited by examiner

*Primary Examiner*—Steven Loke
(74) *Attorney, Agent, or Firm*—McDermott, Will & Emery

(57) ABSTRACT

A gate electrode layer is formed opposite to a p type backgate region posed between an n type source region and an n type epitaxial region, with a gate insulating layer interposed therebetween. A sidewall insulating layer is formed to cover a sidewall of the gate electrode layer. A p type backgate region has a relatively shallow p type diffusion region and a relatively deep p type diffusion region. The relatively deep p type diffusion region has a portion overlapping the relatively shallow p type diffusion region, and has its end portion at the substrate surface located directly beneath the sidewall insulating layer. Accordingly, a semiconductor device and a manufacturing method thereof that allow easy control of the threshold voltage of a DMOS transistor and facilitate realization of a rapidly operating bipolar transistor are attained.

3 Claims, 14 Drawing Sheets

SEMICONDUCTOR DEVICE WITH DMOS AND BI-POLAR TRANSISTORS

BACKGROUND OF THE INVENTION

1. Field of the Invention

The present invention relates to a semiconductor device and a manufacturing method thereof, and more particularly to a semiconductor device mounting a DMOS (Double diffusion Metal Oxide Semiconductor) transistor and a bipolar transistor in a mixed manner, and a method of manufacturing the same.

2. Description of the Background Art

A semiconductor device having a DMOS transistor and a bipolar transistor mounted in a mixed way has been disclosed in Japanese Patent Laying-Open No. 8-321556, for example. Hereinafter, a technique disclosed in the document will be described as an example of a conventional semiconductor device and a manufacturing method thereof, particularly focusing on a high voltage DMOS transistor and an npn bipolar transistor.

FIGS. 14A and 14B are cross sectional views schematically showing a configuration of a conventional semiconductor device.

Referring to FIGS. 14A and 14B, regions RA and RB are regions for forming a high voltage DMOS transistor and a low voltage DMOS transistor, respectively. A region RC is a CMOS (Complementary Metal Oxide Semiconductor) transistor forming region. Regions RD and RE are npn type and pnp type bipolar transistors forming regions, respectively, and a region RF is an EEPROM (Electrically Erasable Programmable Read Only Memory) cell forming region.

In high voltage DMOS transistor region RA, a high voltage n type well region 144 is formed on a p type substrate 141, with an n$^+$ region 142 interposed therebetween.

On the surface of high voltage n type well region 144, a p type region 101 consisting of a relatively deeply formed p type body region 101b and a relatively shallowly formed p type channel region 101a is formed. In p type region 101, an n type source region 102 is formed. A gate electrode layer 106 is formed opposite to p type region 101 that is sandwiched between high voltage n type well region 144 and n type source region 102, with a gate insulating layer 105 interposed therebetween. Gate electrode layer 106 has an end portion extending to overlay a field oxide film 151, and has side surfaces each covered with a respective sidewall insulating layer 107.

In npn bipolar transistor region RD, a high voltage n type well region 144 and an n$^+$ buried region 114 are formed on p type substrate 141, with an n$^+$ region 142 interposed therebetween. On the surface of high voltage n type well region 144, a p type base region 111 consisting of a relatively shallowly formed p type region 111a and a relatively deeply formed p type body region 111b is formed. An n$^+$ emitter region 112 is formed in p type base region 111. An n$^+$ collector contact region 114 is formed on the surface of n$^+$ buried region 114.

Note that high voltage DMOS transistor region RA and npn bipolar transistor region RD, for example, are electrically isolated from other element forming regions by p type isolating regions 143, p type well regions 145a, upper region isolating regions 145b, and field oxide films 151.

Next, a method of manufacturing p type region 101 of the high voltage DMOS transistor and base region 111 of the npn bipolar transistor in this semiconductor device will be described.

FIGS. 15A, 15B, 16A and 16B are simplified cross sectional views showing, in the order of process steps, a method of manufacturing the conventional semiconductor device. Referring first to FIGS. 15A and 15B, a photoresist 161 is patterned by normal photolithography, and using the resist pattern 161 as a mask, a polycrystalline silicon (polysilicon) layer 171 is subjected to etching, to selectively expose the substrate surface. A p type dopant, e.g., boron, is ion implanted into thus exposed regions at 150 to 250 keV, substantially at a right angle with respect to the substrate surface. Accordingly, a p type body region 101b is formed in high voltage DMOS transistor region RA, and a p type body region 111b is formed in npn bipolar transistor region RD. Thereafter, resist pattern 161 is completely removed.

Referring to FIGS. 16A and 16B, a p type dopant, e.g., boron, is again implanted into the regions exposed from polysilicon layer 161 at about 150 keV, at an angle of about 30° to 45° with respect to the perpendicular of the substrate surface. Accordingly, a p type channel region 101a is formed in high voltage DMOS transistor region RA, and a p type region 111a is formed in npn bipolar transistor region RD. Thus, p type channel region 101a and p type body region 101b constitute a p type region 101 in high voltage DMOS transistor region RA, and p type region 111a and p type body region 111b constitute a p type base region 111 in npn bipolar transistor region RD.

Thereafter, a gate electrode layer is formed by patterning polysilicon layer 171, a sidewall insulating layer 107 is formed to cover sidewalls of the gate electrode layer, and n type source region 102, n$^+$ emitter region 112 and others are formed. The semiconductor device as shown in FIGS. 14A and 14B is thus completed.

The above-described conventional semiconductor device and the manufacturing method thereof, however, suffer from problems that the threshold voltage Vth of the DMOS transistor is hard to control freely, and that a rapidly operating npn bipolar transistor is difficult to realize. These will now be described in detail.

In the conventional manufacturing method, as shown in FIGS. 16A and 16B, an impurity is ion implanted using as a mask polysilicon layer 171 that is to be a gate electrode, to form p type channel region 101a in high voltage DMOS transistor region RA. Since heat treatment causes this p type channel region 101a to diffuse, its end portion SB at the substrate surface extends to directly beneath the gate electrode layer 106, as shown in FIG. 17.

An overlapping length L$_0$ of p type channel region 101a and p type body region 101b in the channel region posed between n type source region 102 and high voltage n type well region 144 thus becomes long. Accordingly, it is almost impossible to control the threshold voltage Vth of high voltage DMOS transistor independently and solely by p type channel region 101a. The longer the overlapping length L$_0$, the more difficult to control the threshold voltage Vth.

As an approach to realize a rapidly operating bipolar transistor, there is a technique to narrow the width (so-called base width) W of base region 111 directly beneath n$^+$ emitter region 112, as shown in FIG. 18. To decrease base width W, it is necessary to make p type region 111b of high concentration so as to increase a breakdown voltage of base region 111. When making p type region 111b of high concentration, however, p type body region 101b shown in FIG. 17, that is to be formed at the same time as p type region 111b, also becomes of high concentration. Such high concentration p type body region 101b leads to longer diffusion length of the impurity within p type body region 101b, and hence, longer overlapping length $L_0$ of p type channel region 101a and p type body region 101b. Therefore, it becomes still more difficult to control the threshold voltage Vth of the DMOS transistor.

In other words, in order to allow easy control of the threshold voltage Vth of DMOS transistor, base width W of the npn bipolar transistor should be made sufficiently large. This, however, makes difficult to realize an npn bipolar transistor that can operate at high speed.

SUMMARY OF THE INVENTION

An object of the present invention is to provide a semiconductor device which permits easy control of the threshold voltage Vth of DMOS transistor and facilitates realization of a rapidly operating bipolar transistor, and a manufacturing method thereof.

The semiconductor device according to the present invention is specifically a semiconductor device having an insulated gate type field effect transistor, which includes: a semiconductor substrate; a gate electrode layer of the insulated gate type field effect transistor; a sidewall insulating layer; a first impurity region of the second conductivity type; a second impurity region of the second conductivity type; and a third impurity region of the first conductivity type. The semiconductor substrate includes a main surface and a region of the first conductivity type. The gate electrode layer is formed on the main surface of the semiconductor substrate, with a gate insulating layer interposed therebetween. The sidewall insulating layer is formed to cover a sidewall of the gate electrode layer. The first impurity region is formed in the region of the first conductivity type, and has a portion located at the main surface exposed from the gate electrode layer and the sidewall insulating layer, and has its end portion at the main surface extending to the region directly beneath the gate electrode layer. The second impurity region has a portion located at the main surface exposed from the gate electrode layer and the sidewall insulating layer, has its end portion at the main surface located directly beneath the sidewall insulating layer, and is formed with a diffusion depth that is deeper from the main surface than the first impurity region and to have a portion overlapping the first impurity region. The third impurity region, that is to become either one of source and drain regions of the insulated gate type field effect transistor, is formed at the main surface within the first and second impurity regions so as to sandwich the first impurity region located directly beneath the gate electrode layer between the region of the first conductivity type and the third impurity region.

In the semiconductor device according to the present invention, the second impurity region has an end portion at the main surface located directly beneath the sidewall insulating layer, instead of extending to the region underneath the gate electrode layer as in the conventional example. Therefore, it becomes possible to shorten the overlapping length of, or even eliminate the overlapping portion of, the first and second impurity regions in the channel region of the insulated gate type field effect transistor. Accordingly, it becomes easy to control the threshold voltage of the insulated gate type field effect transistor solely by the first impurity region, thus simplifying the control of threshold voltage.

Preferably, the above semiconductor device is further provided with a bipolar transistor having a base region. The base region includes first and second base regions of the second conductivity type. The first base region is formed at the main surface, in the same manufacturing step as the first impurity region. The second base region is formed at the main surface in the same manufacturing step as the second impurity region, and has a portion overlapping the first base region.

Since the overlapping length of the first and second impurity regions can be shortened as described above, the threshold voltage of the insulated gate type field effect transistor can be easily controlled even when the second impurity region is formed of high concentration. Therefore, the second base region that is formed in the same manufacturing step as the second impurity region can also be formed with high concentration, thereby ensuring a large breakdown voltage of the base region. Accordingly, the second base region can be made shallow, and the width (so-called base width) of the second base region directly beneath the first base region can be decreased. It thus becomes possible to make the bipolar transistor operate at high speed.

Preferably, the above semiconductor device is further provided with an element separating insulating layer formed at the main surface of the semiconductor substrate, and one end of the gate electrode layer overlays the element separating insulating layer.

Accordingly, the insulated gate type field effect transistor can be made to be a high breakdown voltage transistor.

In the above semiconductor device, the gate electrode layer preferably includes a configuration in which a polysilicon layer doped with an impurity and a silicide layer are stacked one on top of the other.

Accordingly, it becomes possible to reduce resistance of the gate electrode layer.

The manufacturing method of the semiconductor device according to the present invention is specifically a method of manufacturing a semiconductor device having an insulated gate type field effect transistor and a bipolar transistor, which includes the following steps.

A region of the first conductivity type is first formed within a semiconductor substrate in an insulated gate type field effect transistor region. A gate electrode layer is then formed on the main surface of the semiconductor substrate within the insulated gate type field effect transistor region, with a gate insulating layer interposed therebetween. The second conductivity type impurity is then selectively introduced into the main surface of the semiconductor substrate by rotational oblique ion implantation, to form, in the insulated gate type field effect transistor region, a first impurity region of the second conductivity type, which has a portion located at the main surface exposed from the gate electrode layer and has its end portion at the main surface extending to the region directly beneath the gate electrode layer, and to form, in the bipolar transistor region, a first base region of the second conductivity type at the main surface. A sidewall insulating layer is then formed to cover a sidewall of the gate electrode layer. The second conductivity type impurity is selectively introduced into the main surface of the semiconductor substrate, substantially at a right angle with respect to the main surface to form, in the insulated gate type field effect transistor region, a second impurity region of the second conductivity type, which has a portion located at the main surface exposed from the gate electrode layer and the sidewall insulating layer, has its end portion at the main surface located directly beneath the sidewall insulating layer, and is formed with a diffusion depth deeper from the main surface than the first impurity region and to have a portion overlapping the first impurity region, and to form, in the bipolar transistor region, a second base region of the second conductivity type, which is formed with a diffusion depth that is deeper from the main surface than the first base region and to have a portion overlapping the first base region. A third impurity region of the first conductivity type, that is to become either one of source and drain regions of the insulated gate type field effect transistor, is formed at the main surface within the first and second impurity regions, to cause the first impurity region located directly beneath the gate electrode layer to be sandwiched between the region of the first conductivity type and the third impurity region.

In the manufacturing method of the semiconductor device according to the present invention, the end portion of the second impurity region at the main surface is located directly beneath the sidewall insulating layer, instead of extending to the region underneath the gate electrode layer as in the conventional example. Therefore, the overlapping length of the first and second impurity regions in the channel region can be made shorter, or, the overlapping portion thereof can even be eliminated. Accordingly, it becomes easy to control the threshold voltage of insulated gate type field effect transistor solely by the first impurity region, thereby simplifying the control of threshold voltage.

Since the overlapping length of the first and second impurity regions can be made shorter, the threshold voltage of the insulated gate type field effect transistor can be controlled easily, even when the second impurity region is formed of high concentration. Therefore, the second base region that is to be formed in the same manufacturing step as the second impurity region can also be made of high concentration, thereby ensuring a large breakdown voltage of the base region. Accordingly, the second base region can be formed shallower to decrease the width (so-called base width) of second base region directly beneath the first base region. This helps speed up the operation of bipolar transistor.

Preferably, in the above manufacturing method of the semiconductor device, the step of introducing the impurity by rotational oblique ion implantation is performed by introducing the impurity at an angle between 45° and 60° with respect to the perpendicular of the main surface. In the step of introducing the impurity substantially at a right angle with the main surface, the impurity is introduced at an angle between 0° to 10° with respect to the perpendicular of the main surface.

Accordingly, the first and second impurity regions can be formed in more appropriate positions.

Preferably, the above manufacturing method of the semiconductor device further includes the step of forming an element separating insulating layer at the main surface of the semiconductor substrate, and the gate electrode layer is formed to have one end portion overlaying the element separating insulating layer.

Accordingly, the insulated gate type field effect transistor can be made to be a transistor of high breakdown voltage.

Preferably, in the above method of manufacturing the semiconductor device, the gate electrode layer is formed to have a configuration with a polysilicon layer doped with an impurity and a silicide layer stacked one on top of the other.

Accordingly, resistance of the gate electrode layer can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

Figure 1:
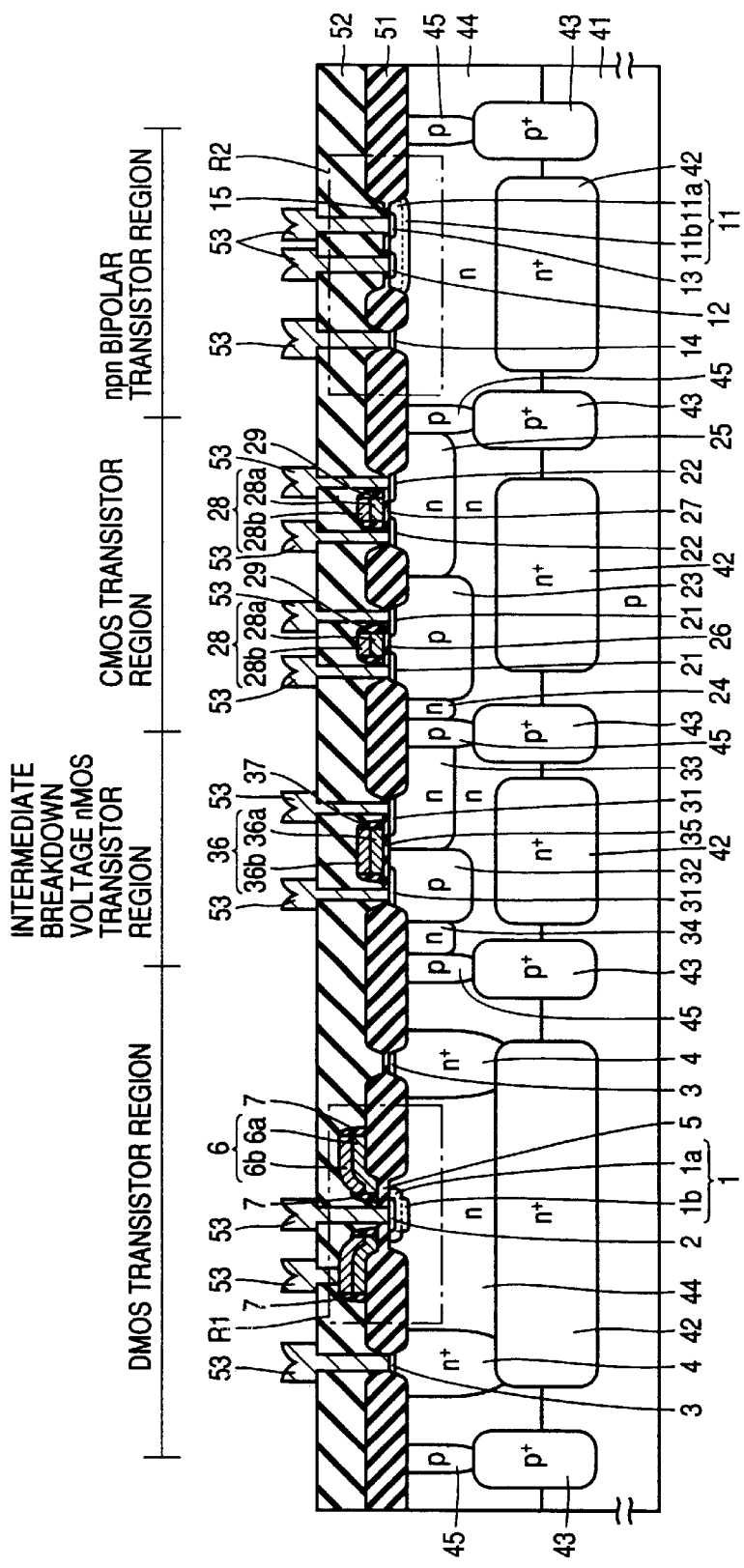
FIG. 1 is a cross sectional view schematically showing a configuration of the semiconductor device according to an embodiment of the present invention.

Referring primarily to FIG. 1, the semiconductor device according to an embodiment is specifically a semiconductor device which mounts in a mixed manner, a DMOS transistor, an intermediate breakdown voltage nMOS transistor, a CMOS transistor, and an npn bipolar transistor.

In a respective element forming region, an n type epitaxial region 44 is formed on a p type substrate 41, with an n$^+$ diffusion region 42 interposed therebetween. Respective element forming regions are electrically isolated from one another by p$^+$ diffusion regions 43, p type diffusion regions 45 and field insulating layers 51.

In the DMOS transistor region, a p type backgate region 1 consisting of p type diffusion regions 1a and 1b is formed on the surface of n type epitaxial region 44.

Figure 2:
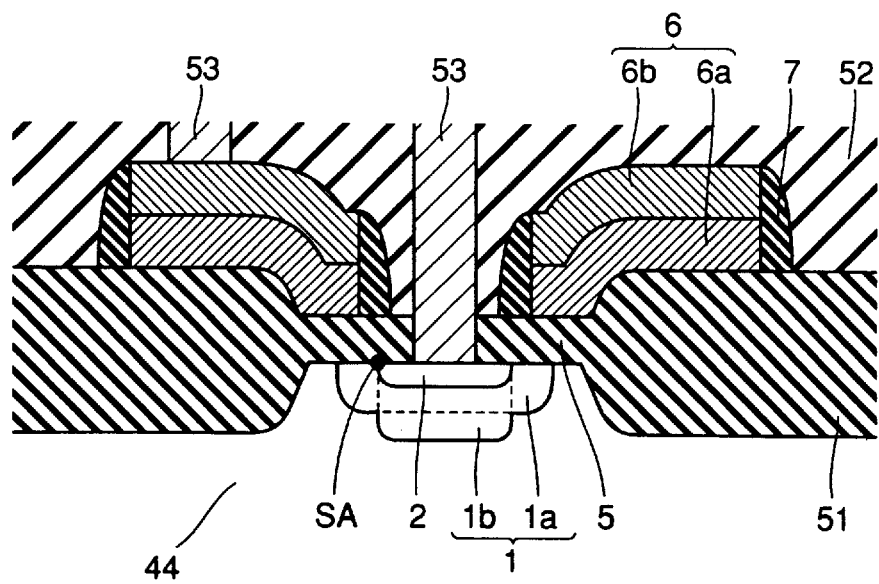
FIGS. 2 and 3 are enlarged views of regions R1 and R2 in FIG. 1, respectively.

Referring primarily to FIG. 2, p type diffusion region 1b has a region overlapping p type diffusion region 1a, and is formed deeper than p type diffusion region 1a. P type diffusion region 1a is located at the substrate surface exposed from a gate electrode layer 6 and a sidewall insulating layer 7, and has its end portion at the substrate surface extending to the region directly beneath the gate electrode layer 6. P type diffusion region 1b is located at the substrate surface exposed from gate electrode layer 6 and sidewall insulating layer 7, and has its end portion SA at the substrate surface located directly beneath sidewall insulating layer 7.

Primarily with reference to FIG. 1, an n type source region 2 is formed in the p type backgate region 1. Gate electrode layer 6 is formed opposite to p type backgate region 1 that is sandwiched between n type source region 2 and n type epitaxial region 44, with a gate insulating layer 5 interposed therebetween. This gate electrode layer 6 has a structure with a polysilicon layer doped with impurity (hereinafter, referred to as a doped polysilicon layer) 6a and a tungsten silicide layer 6b stacked one on top of the other, for example, and one of its end portions is configured to overlay field insulating layer 51 made of, e.g., a silicon oxide film. A respective sidewall of gate electrode layer 6 is covered by a sidewall insulating layer 7, which is made of a silicon oxide film, for example.

An $n^+$ diffusion region 4 is formed from the surface of n type epitaxial region 44 to reach $n^+$ diffusion region 42. A drain contact region 3 is formed on the surface of $n^+$ diffusion region 4.

In the npn bipolar transistor region, a p type base region 11 is formed at the surface of n type epitaxial region 44, which consists of p type diffusion regions 11a and 11b.

Figure 3:
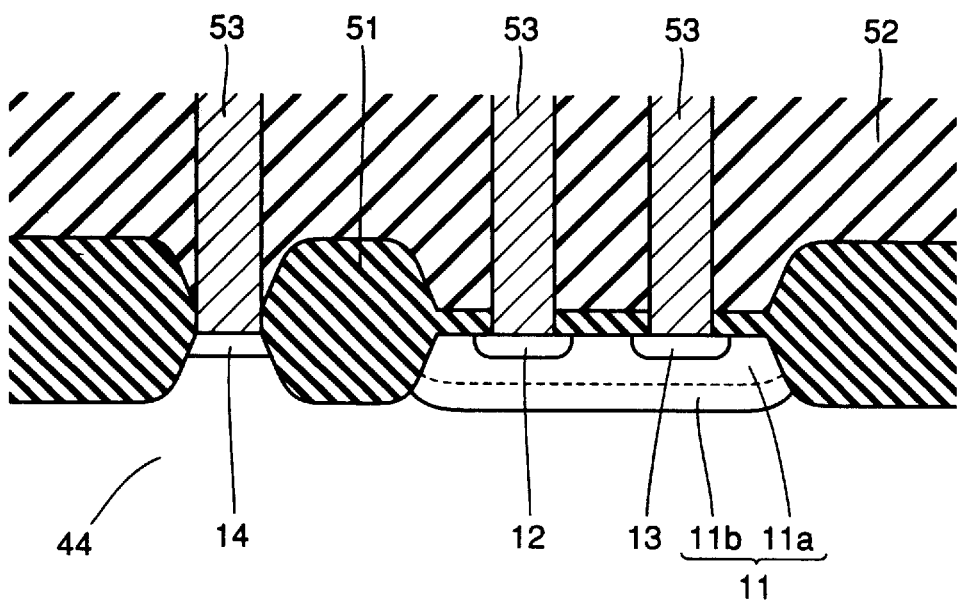

Referring primarily to FIG. 3, p type diffusion region 11b is formed deeper than p type diffusion region 11a, and has a region overlapping p type diffusion region 11a. P type diffusion region 11a is formed in the same manufacturing step as p type diffusion region 1a of the DMOS transistor region, and therefore, it is formed of the same impurity type as and has the same diffusion depth as p type diffusion region 1a. Similarly, p type diffusion region 11b is formed in the same step as p type diffusion region 1b of the DMOS transistor region, and thus is formed of the same impurity type as and has the same diffusion depth as p type diffusion region 1b.

Primarily with reference to FIG. 1, an n type emitter region 12 and a $p^+$ base contact region 13 are formed within the p type base region 11. A collector contact region 14 is formed on the surface of n type epitaxial region 44.

In the intermediate breakdown voltage nMOS transistor region, n type diffusion regions 33 and 34, and a p type diffusion region 32 sandwiched therebetween are formed on the surface of n type epitaxial region 44. Formed on the surface of n type diffusion region 33 is either one of source and drain regions of the intermediate breakdown voltage nMOS transistor, and the other one of source and drain regions thereof is formed on the surface of p type diffusion region 32. A gate electrode layer 36 is formed at a region between the source and drain regions, with a gate insulating layer 35 interposed therebetween. Gate electrode layer 36 has a structure with a doped polysilicon layer 36a and a tungsten silicide layer 36b stacked one on top of the other, for example. Formed to cover a respective sidewall of gate electrode layer 36 is a sidewall insulating layer 37, which is made of, e.g., a silicon oxide film.

In the CMOS transistor region, n type diffusion regions 24 and 25, and a p type diffusion region 23 sandwiched therebetween are formed on the surface of n type epitaxial region 44. A pMOS transistor is formed on the surface of n type diffusion region 25, and an nMOS transistor is formed on the surface of p type diffusion region 23.

The pMOS transistor has a pair of p type source-drain regions, and a gate electrode layer 28 formed on a region between the pair of source-drain regions, with a gate insulating layer 27 interposed therebetween. The nMOS transistor has a pair of n type source-drain regions 21, and a gate electrode layer 28 formed on a region between the pair of source-drain regions 21, with a gate insulating layer 26 interposed therebetween.

Respective gate electrode layers 28 of the pMOS and nMOS transistors each have, for example, a structure with a doped polysilicon layer 28a and a tungsten silicide layer 28b stacked one on top of the other. To cover a respective sidewall of gate electrode layer 28, a sidewall insulating layer 29 is formed of, e.g., a silicon oxide film.

An interlayer insulating layer 52 made of a silicon oxide film, for example, is formed to cover the elements in respective element forming regions. Contact holes are provided in interlayer insulating layer 52, through which interconnection line layers 53 made of aluminum, for example, are formed to electrically connect to respective underlayers.

Hereinafter, a method of manufacturing the present embodiment will be described.

Figure 4:
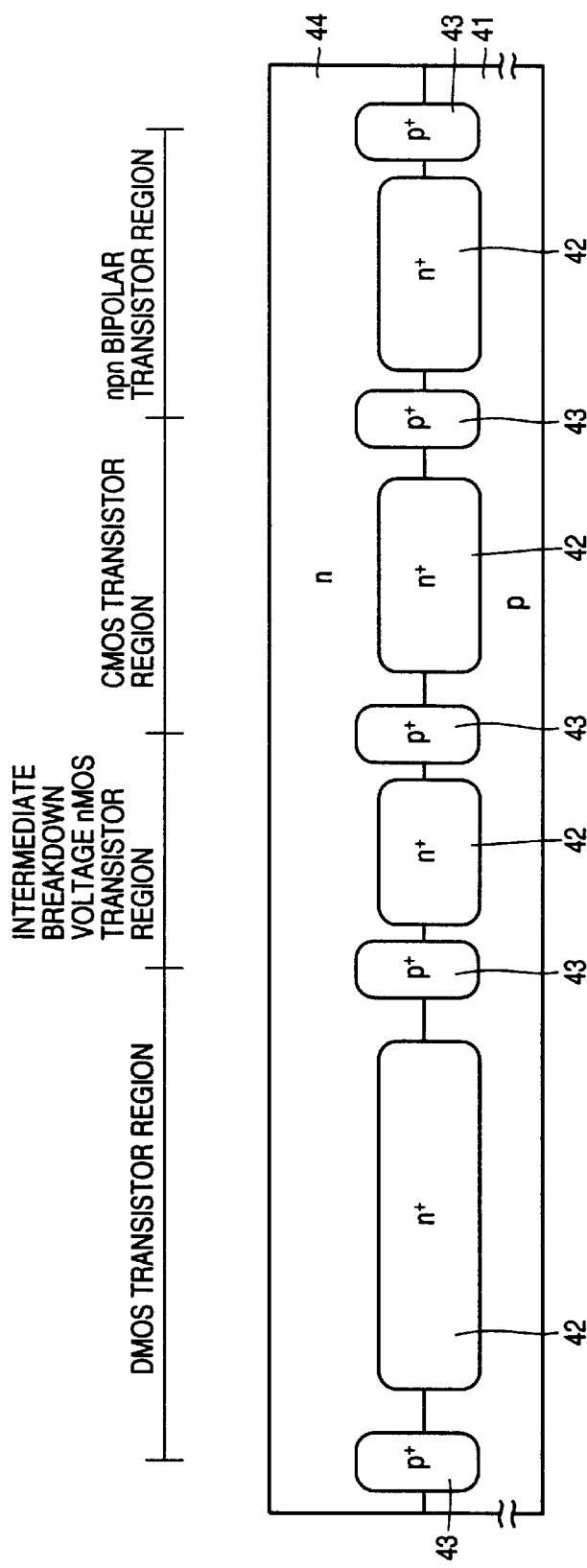
FIGS. 4 to 8 are simplified cross sectional views showing, in the order of process steps, a method of manufacturing the semiconductor device according to an embodiment of the present invention.

Firstly, with reference to FIG. 4, an oxide film (not shown) is formed by oxidizing the surface of p type substrate 41 made of silicon, for example, and is patterned by normal photolithography and etching. Using thus patterned oxide film as a mask, antimony is introduced into p type substrate 41. Drive at 1240° C. is then performed to form an $n^+$ diffusion region 42. The patterned oxide film is then removed.

Next, an oxide film (not shown) some 10 nm thick is formed on p type substrate 41, and patterned by normal photolithography and etching. Using such patterned oxide film as a mask, boron is introduced into p type substrate 41, and then drive at 1100° C. is conducted to form a $p^+$ diffusion region 43. Thereafter, the patterned oxide film is removed. $N^+$ diffusion region 42 and $p^+$ diffusion region 43 are thus formed on p type substrate 41, on which an epitaxial layer 44 is further formed.

Figure 5:
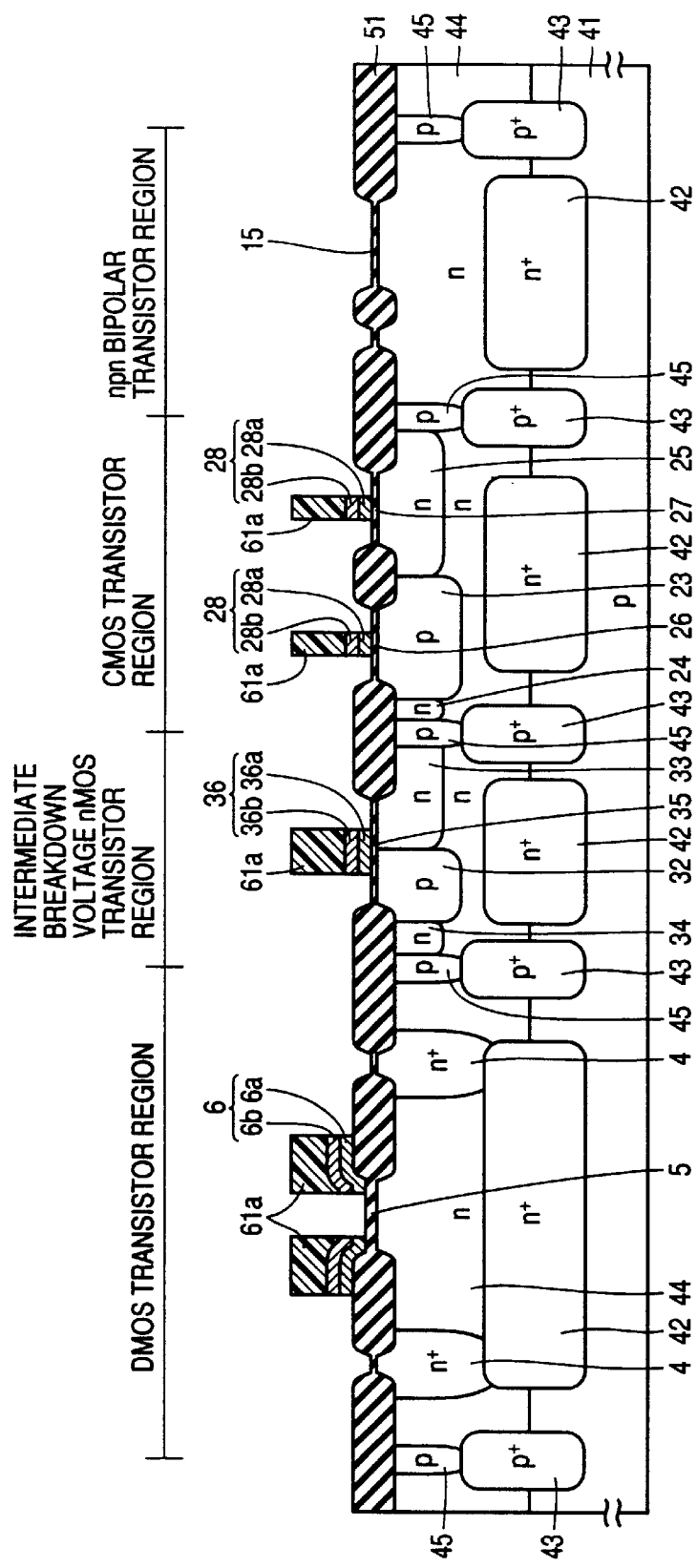

Referring to FIG. 5, an oxide film (not shown) is formed by oxidizing the surface of n type epitaxial layer 44, and is patterned by normal photolithography and etching. Glass containing phosphorus is formed on the patterned oxide film, and then drive is conducted to cause phosphorus in the glass to diffuse from openings of the patterned oxide film into n type epitaxial layer 44. Thus formed in the DMOS transistor region is an $n^+$ diffusion region 4 for reducing resistance at the drain portion of the DMOS transistor. Thereafter, the glass containing phosphorus and the patterned oxide film thereunder are completely removed.

On the surface of n type epitaxial region 44, a some 10 nm thick oxide film (not shown) and a nitride film (not shown) are formed, and the nitride film is patterned by normal photolithography and etching. Using this patterned nitride film as a mask, phosphorus is introduced into the surface of n type epitaxial layer 44. Drive at 950° C. is then performed to form n type diffusion regions 24, 25, 33 and 34. Thereafter, the patterned nitride film and the oxide film thereunder are completely removed.

P type diffusion regions 23, 32 and 45 are formed with process steps substantially the same as those for forming n type diffusion regions 24, 25, 33 and 34, by introducing boron into the surface of n type epitaxial region 44 and then conducting drive at 1180° C. Thereafter, boron is selectively introduced into respective n type epitaxial regions 44 in DMOS and npn bipolar transistor regions, and then drive at 1180° C. is conducted.

The oxide film on the substrate surface is then removed, and a some 10 nm thick oxide film (not shown) and a nitride film (not shown) are formed. The nitride film is then patterned by normal photolithography and etching. Using thus patterned nitride film as a mask, a field insulating layer 51 made of a silicon oxide film, for example, is formed by LOCOS (Local Oxidation of Silicon) technique. Thereafter, the patterned nitride film and the some 10 nm thick oxide film are removed, thereby exposing the substrate surface in the regions other than the field insulating layer 51 forming region.

An oxide film is formed on such exposed substrate surface with a film thickness of 20 nm to 50 nm. Thereafter, the oxide film is selectively removed, leaving an oxide film 5 only at a gate insulating layer forming region in the DMOS transistor region. Thereafter, the entire surface is further subjected to oxidation process. Accordingly, gate insulating layers 26, 27 and 35 made of, e.g., silicon oxide film are formed in the CMOS and nMOS transistor regions; a silicon oxide film 15, for example, is formed in the npn bipolar transistor region; and gate insulating layer 5 in the DMOS transistor region is thickened.

Thereafter, a doped polysilicon layer and a tungsten silicide layer are formed on the entire surface, sequentially stacking those two layers. A resist pattern 61a is formed on the tungsten silicide layer by normal photolithography. Using this resist pattern 61a as a mask, the tungsten silicide layer and the doped polysilicon layer are sequentially patterned. Accordingly, gate electrode layers 6, 28 and 36 are formed, each having a stacked structure of doped polysilicon layer 6a, 28a, 36a and tungsten silicide layer 6b, 28b, 36b, respectively.

Figure 6:
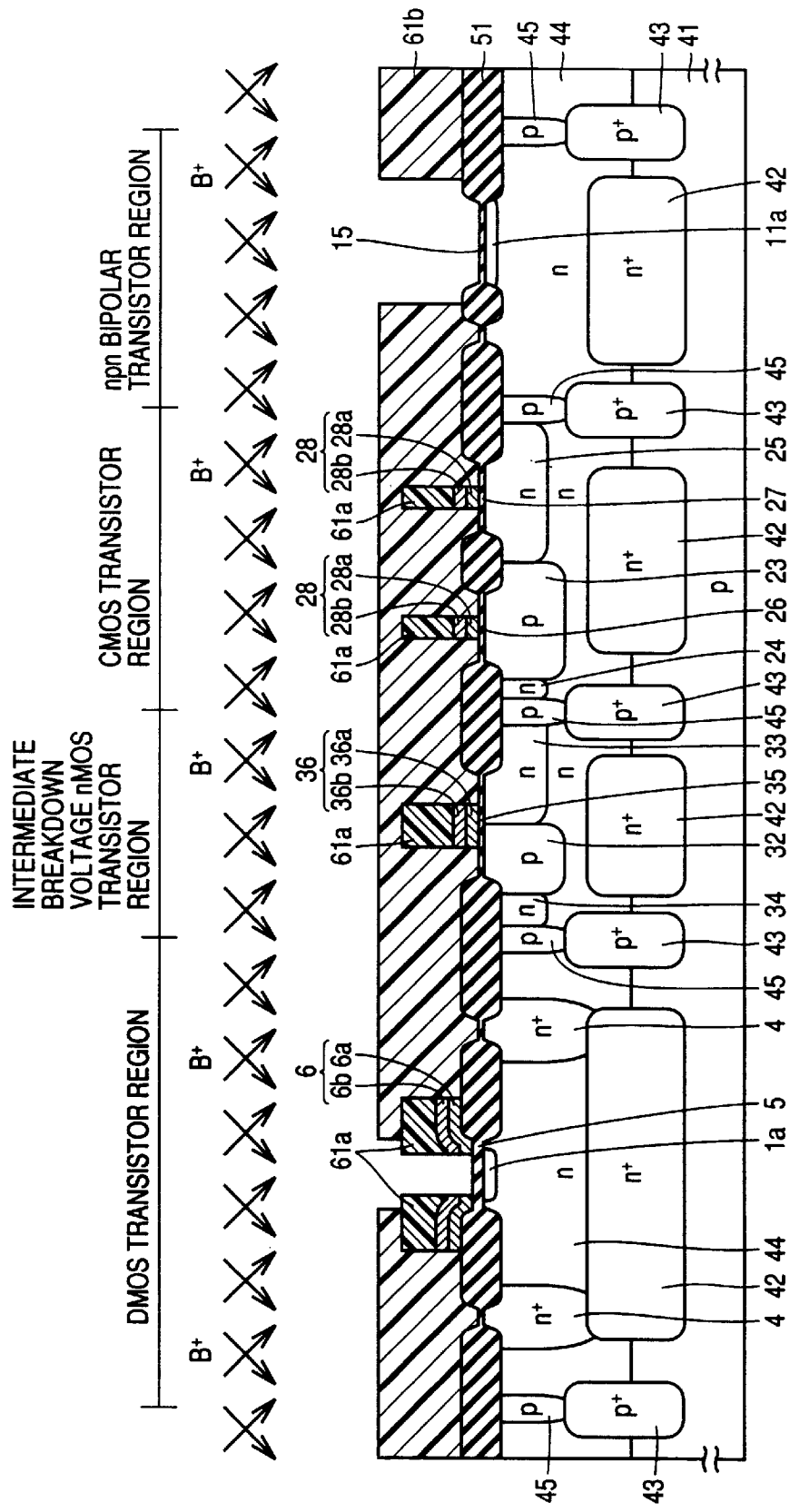

Referring to FIG. 6, a resist pattern 61b is formed by normal photolithography, which exposes the backgate region of DMOS transistor region and the base region of npn transistor region. Using this resist pattern 61b as a mask, boron, for example, is introduced at energy no more than 80 keV by rotational oblique ion implantation at an angle between 45° and 60° with respect to the perpendicular of the substrate surface. P type diffusion regions 1a and 11a are thus formed in the backgate region of DMOS transistor region and the base region of npn bipolar transistor region, respectively. Thereafter, resist patterns 61a and 61b are removed.

Figure 7:
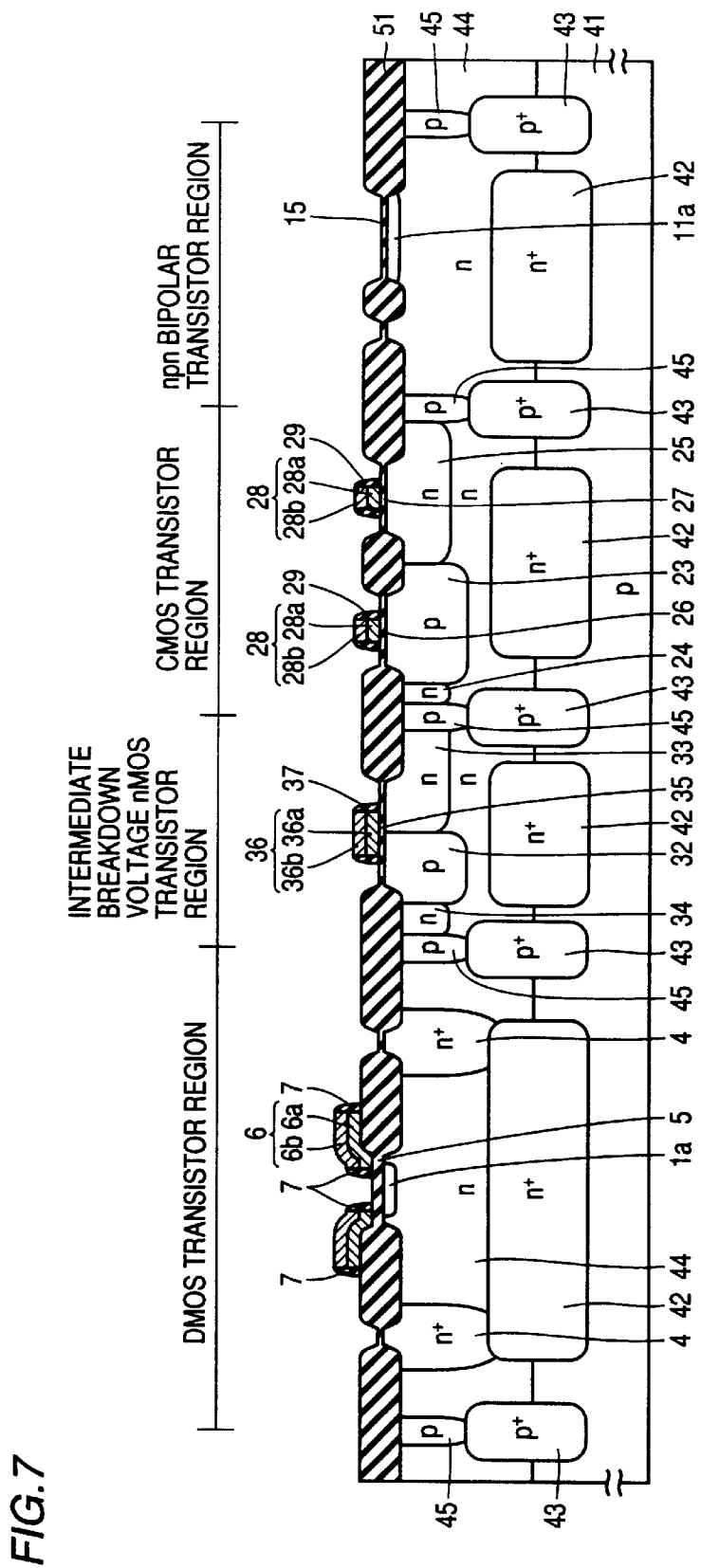

With reference to FIG. 7, an insulating layer made of an oxide film, for example, is formed to cover the entire surface, which layer is then subjected to anisotropic etching until the upper surfaces of respective gate electrode layers 6, 28 and 36 are exposed. Sidewall insulating layers 7, 29 and 37 are thus left to cover sidewalls of gate electrode layers 6, 28 and 36, respectively.

Figure 8:
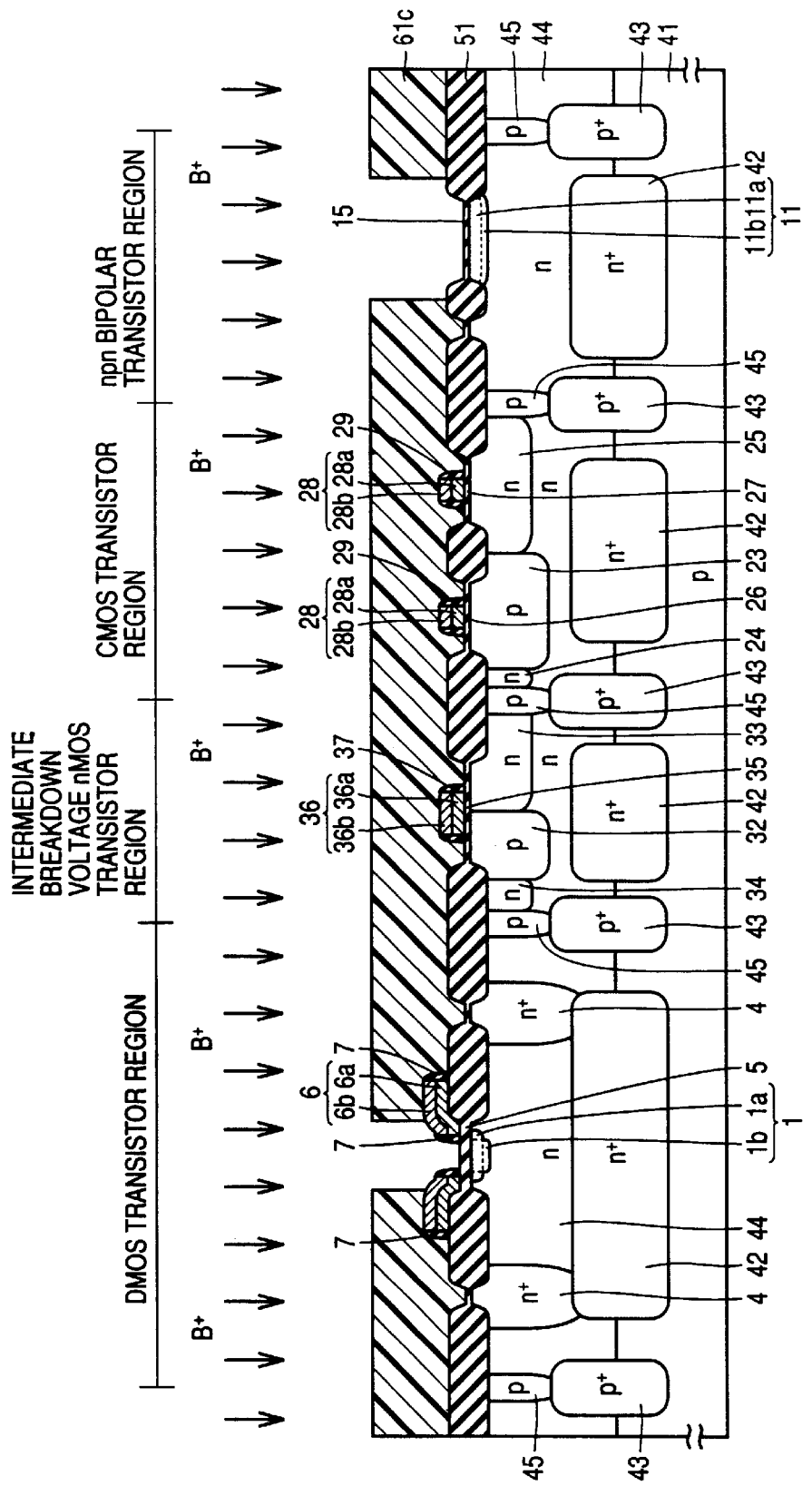

Referring to FIG. 8, a resist pattern 61c is formed by normal photolithography to expose the backgate region of DMOS transistor region and the base region of npn bipolar transistor region. Using this resist pattern 61c as a mask, boron is introduced at energy no more than 70 keV at an angle between 0° to 10° with respect to the perpendicular of the substrate surface.

Thus formed in the DMOS transistor region is a p type diffusion region 1b, which is deeper than p type diffusion region 1a and has a region overlapping p type diffusion region 1a. Formed in the npn bipolar transistor region is a p type diffusion region 11b, which is deeper than p type diffusion region 11a and has a region overlapping p type diffusion region 1a. P type diffusion regions 1a and 1b constitute a p type backgate region 1, and p type diffusion regions 11a and 11b constitute a p type base region 11. Resist pattern 61c is then removed.

Thereafter, as shown in FIG. 1, an n type drain contact region 3 and an n type source region 2 are formed in the DMOS transistor region; n type diffusion regions 31 in the intermediate breakdown voltage nMOS transistor region; n type diffusion regions 21 in the CMOS transistor region; and an n type collector contact region 14 and an n type emitter region 12 in the npn bipolar transistor region. P type diffusion regions 22 in the CMOS transistor region and a p type base contact region 13 in the npn bipolar transistor region are also formed.

Thereafter, an interlayer insulating layer 52 made of a silicon oxide film, for example, is further formed, and is subjected to normal photolithography and etching to form contact holes at desired positions. Interconnection line layers 53 made of aluminum, for example, are then formed by patterning with normal photolithography and etching, to electrically connect to respective underlayers through the contact holes.

Figure 9:
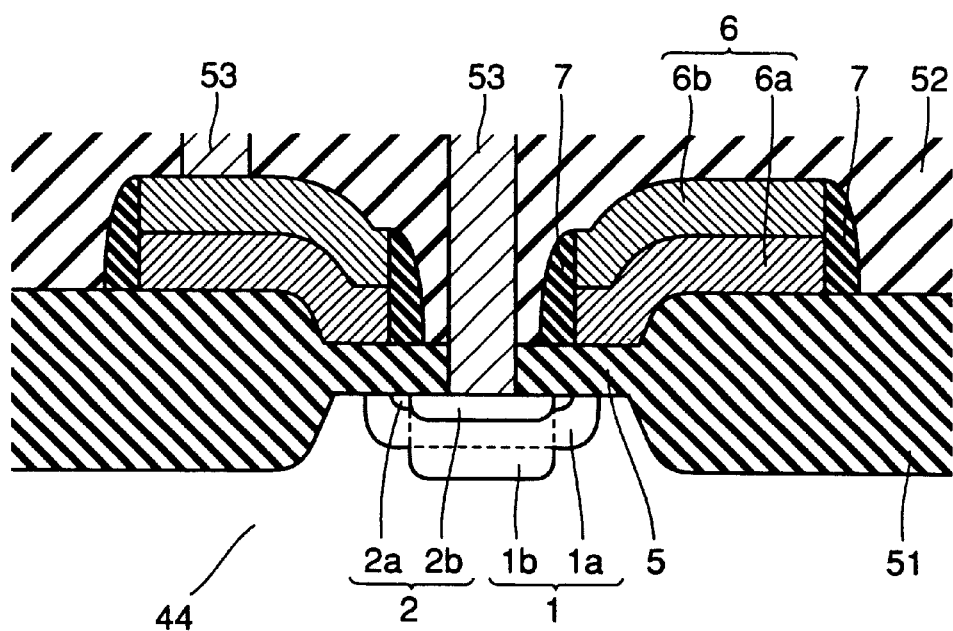
FIG. 9 shows a configuration of a source region of DMOS transistor, formed to have an LDD structure.

In the above-described embodiment, n type source region 2 shown in FIG. 2 has been described as being made of a single impurity region. As shown in FIG. 9, however, it may have an LDD (Lightly Doped Drain) structure consisting of a relatively low concentration n type impurity region 2a and a relatively high concentration n type impurity region 2b.

Furthermore, silicide layers 6b, 28b and 36b constituting parts of respective gate electrode layers 6, 28 and 36 may be any silicide layers other than the above-described tungsten silicide layers.

Hereinafter, a condition under which the end portion SA of p type diffusion region 1b in the substrate surface is placed directly beneath the sidewall insulating layer 7, as shown in FIG. 2, will be discussed.

Figure 10:
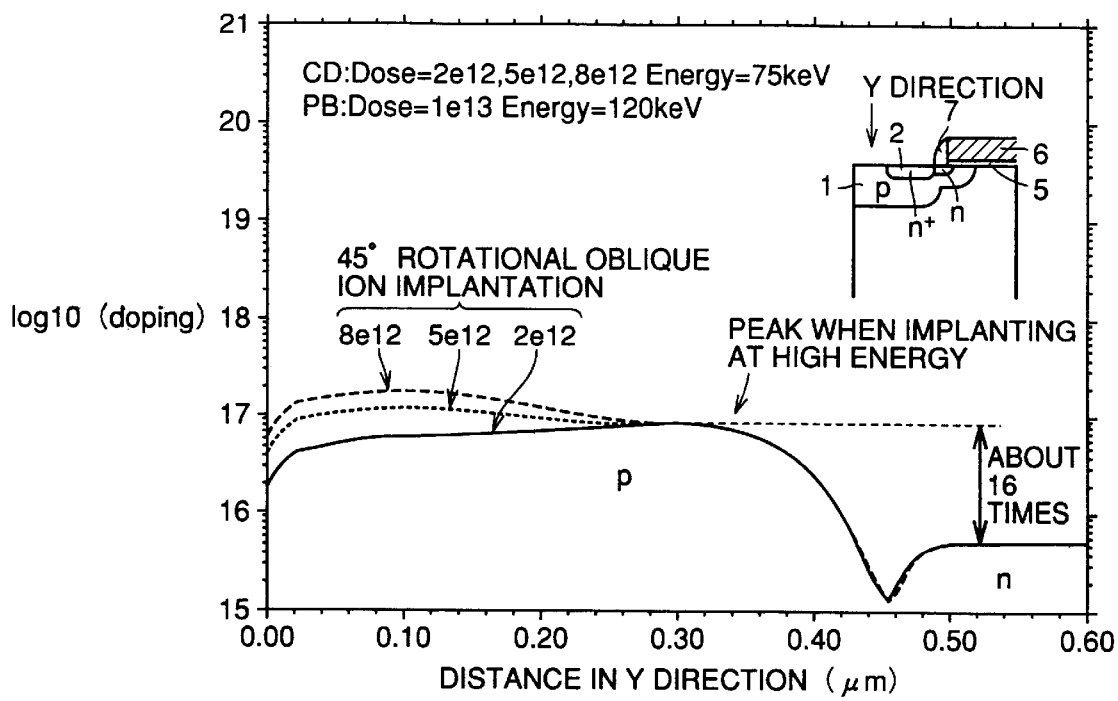
FIG. 10 is a graph showing impurity concentration profile of a p type backgate region, in a direction perpendicular to the substrate surface.

FIG. 10 is a graph showing a process simulation of impurity concentration distribution, taken in a direction perpendicular to the substrate surface (Y direction in the figure), in the p type backgate region of the semiconductor device according to an embodiment of the present invention. Referring to FIG. 10, a peak of the p type impurity concentration profile, which is located deep from the substrate surface, is formed by ion implantation at high energy after formation of sidewall insulating layer 7. As a result, the ratio of the peak concentration of p type impurity by implantation at high energy to the n type impurity concentration of n type epitaxial region 44 became a factor of about 16. The ratio between these impurity concentrations is altered depending on the dosage at each portion. Taking into consideration the stability when forming the p type backgate region by diffusion, this ratio needs to be at least 10.

Figure 11:
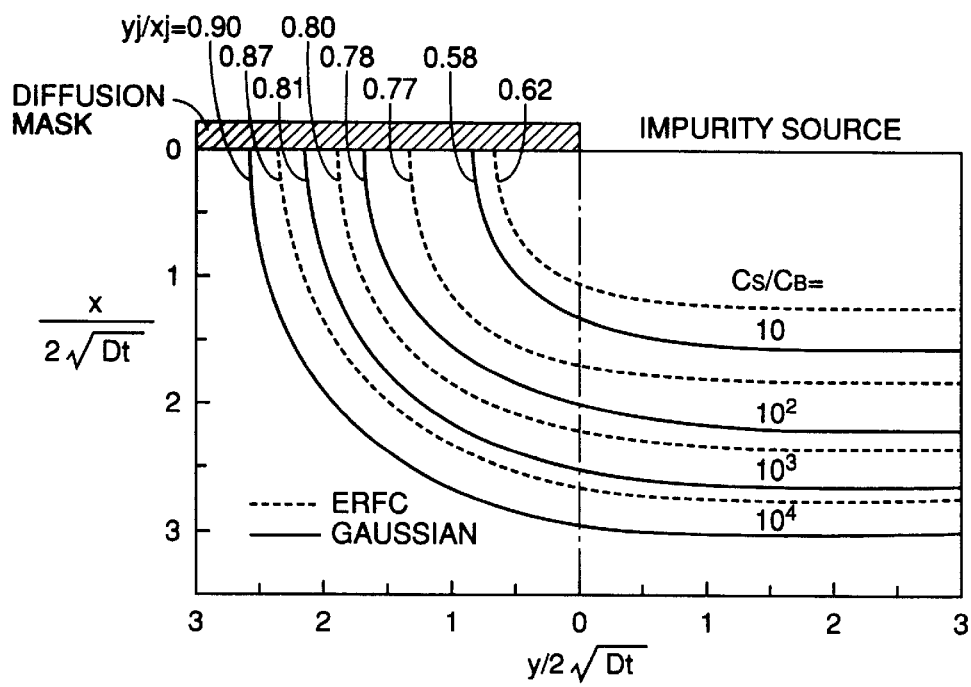
FIG. 11 is a graph showing changes in the ratio of lateral diffusion length/longitudinal diffusion length as $C_S/C_B$ is altered.

FIG. 11 is a graph showing how the ratio of lateral diffusion length to vertical diffusion length (lateral diffusion length/vertical diffusion length) changes as the ratio between source region concentration and substrate region concentration ($C_S/C_B$) is altered, when source impurity is ion implanted while using a diffusion mask. FIG. 11 shows that lateral diffusion length/vertical diffusion length must be at least 0.58, since the ratio of the peak concentration of p type backgate region 1 to the impurity concentration of n type epitaxial region 44 needs to be at least 10 as described above.

Accordingly, referring to FIG. 2, the end portion SA of p type diffusion region 1b in the substrate surface can be positioned at the region directly beneath the sidewall insulating layer 7 if the following equation is satisfied:

$$L' > 0.58 \times (Xr \times Xr - Xi \times Xi)^{1/2} \quad \text{unit: } (\mu m)$$

wherein Xi represents the depth from the substrate surface of the concentration peak of p diffusion due to implantation, Xr represents the true depth of p diffusion (p diffusion depth Xj thus becomes: Xj=Xi+Xr), L' represents the width of sidewall insulating layer 7, and the diffusion profile is approximated by an ellipse.

Next, the relation between the threshold voltage Vth and the breakdown voltage between source and drain BVds of DMOS transistor when altering impurity dosage at the time of formation of the backgate region 1 of DMOS transistor was examined. The result of the examination will be described.

Figure 12:
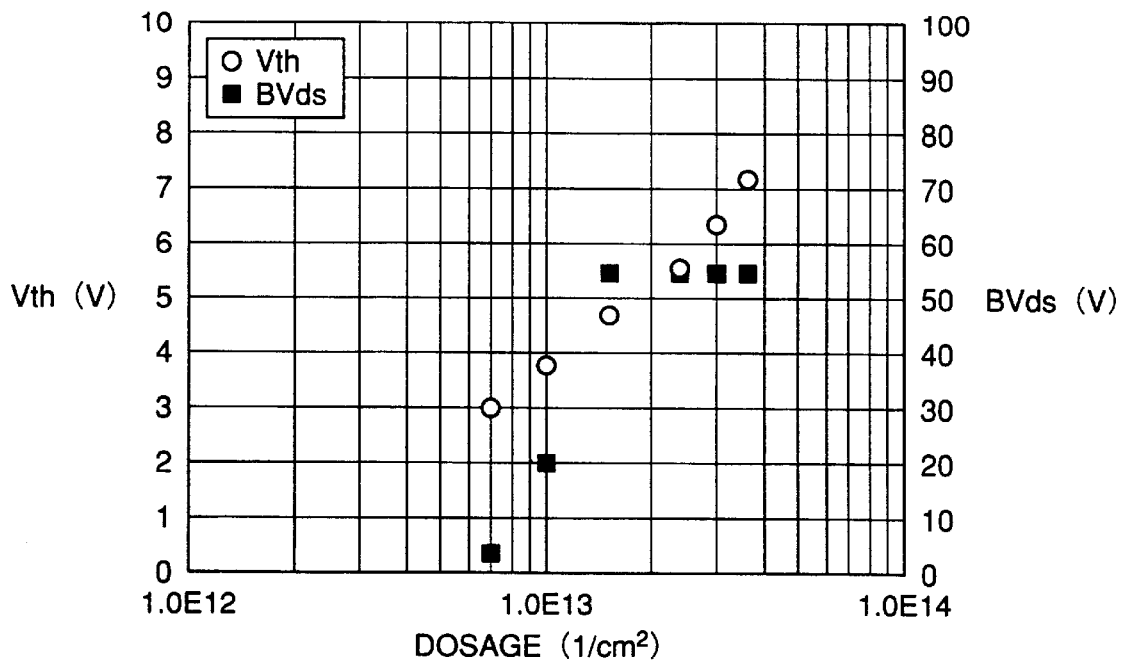
FIG. 12 is a graph showing changes in Vth and BVds of DMOS transistor as the impurity dosage into the backgate region is altered.

FIG. 12 is a graph showing changes in Vth and BVds as impurity dosage is altered. According to the result shown in FIG. 12, Vth gradually increases as the implant dosage increases. In contrast, BVds is saturated at around 1.5E13.

The semiconductor device according to the present embodiment and the manufacturing method thereof allow easy control of the threshold voltage Vth of the DMOS transistor region, and facilitate realization of a rapidly operating bipolar transistor. Hereinafter, these features will be described in detail.

Figure 13A:
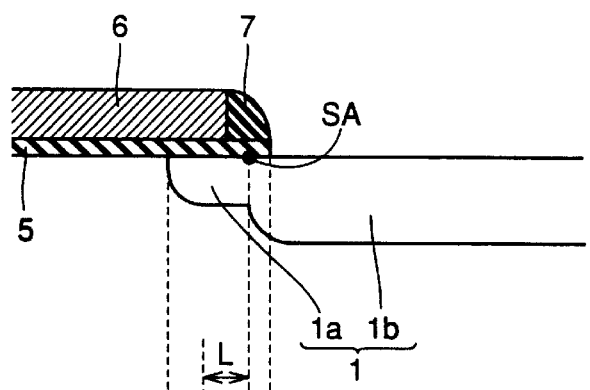
FIGS. 13A and 13B are diagrams comparing configurations of an embodiment of the present invention and of a conventional semiconductor device.
Figure 13B:
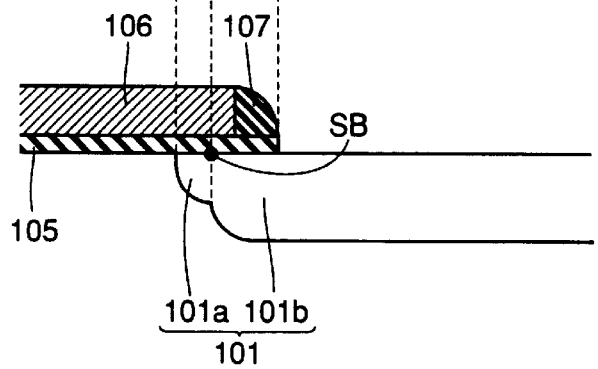
Figure 14A:
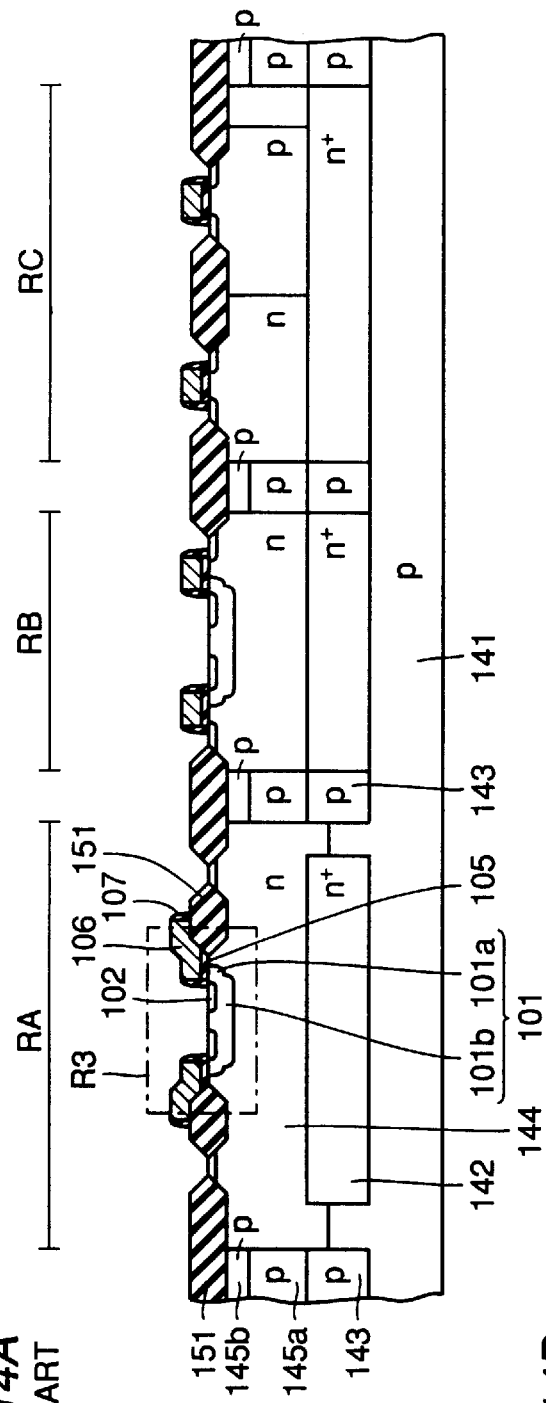
FIGS. 14A and 14B are cross sectional views schematically showing a configuration of a conventional semiconductor device.
Figure 14B:
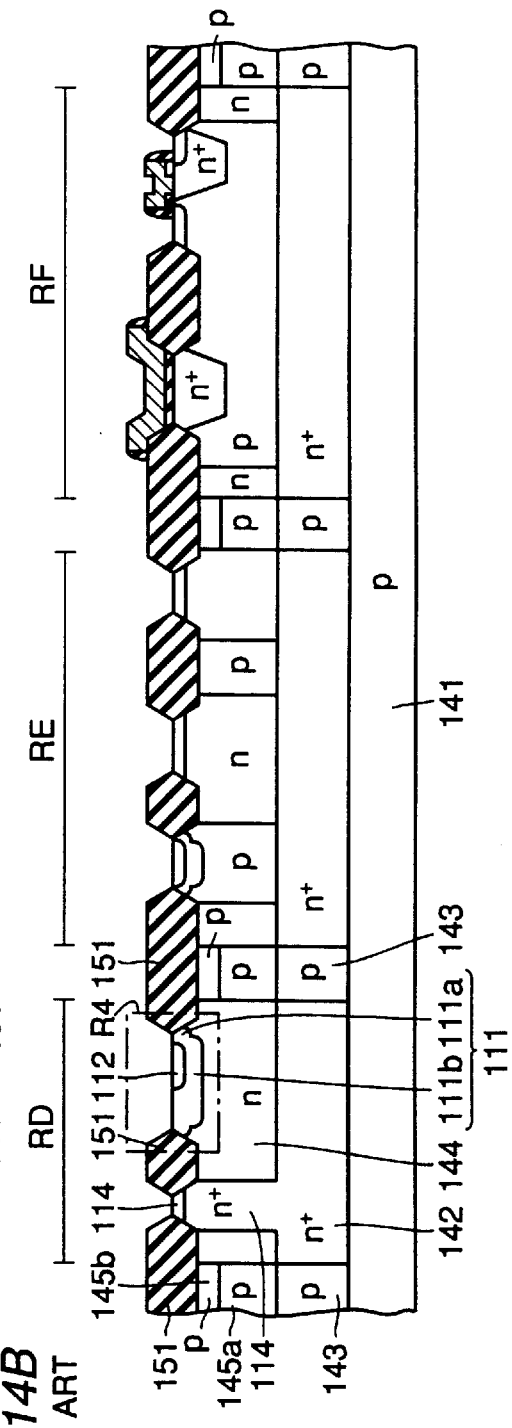
Figure 15A:
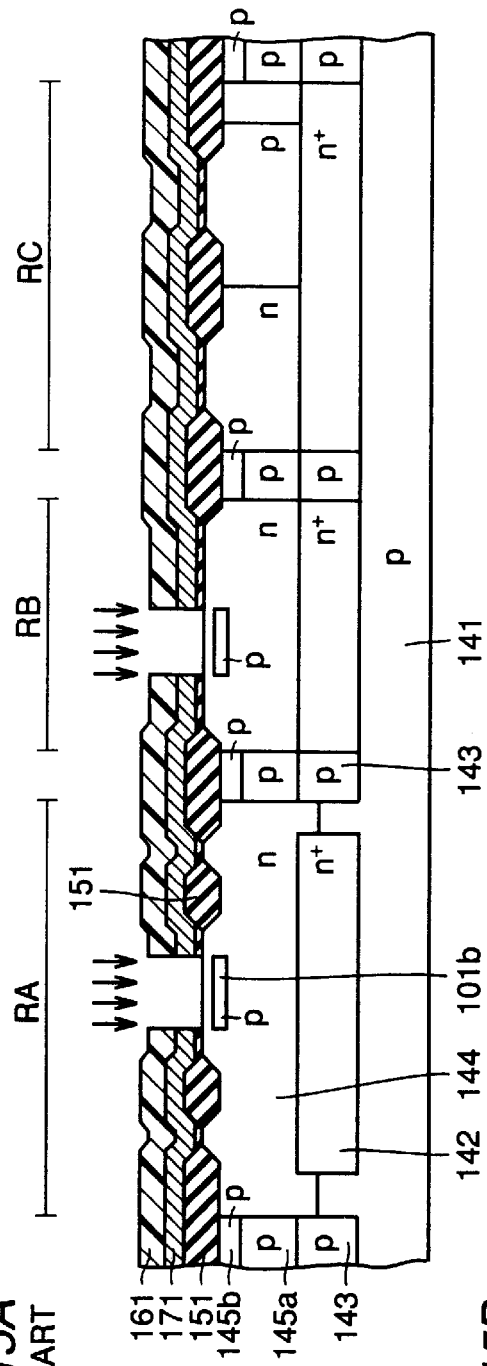
FIGS. 15A, 15B, 16A and 16B are simplified cross sectional views showing, in the order of process steps, a method of manufacturing the conventional semiconductor device.
Figure 15B:
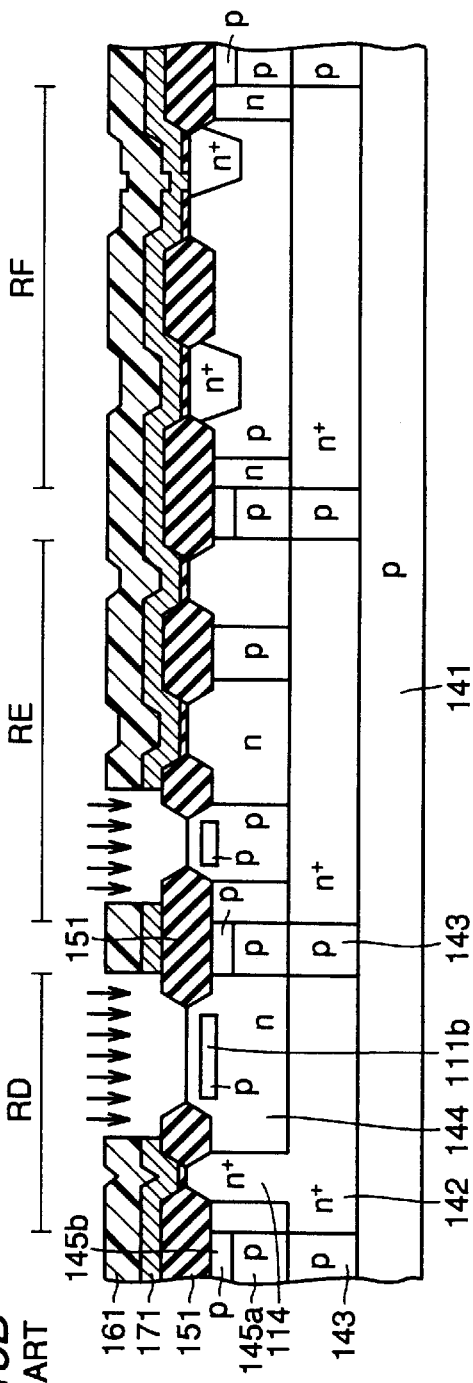
Figure 16A:
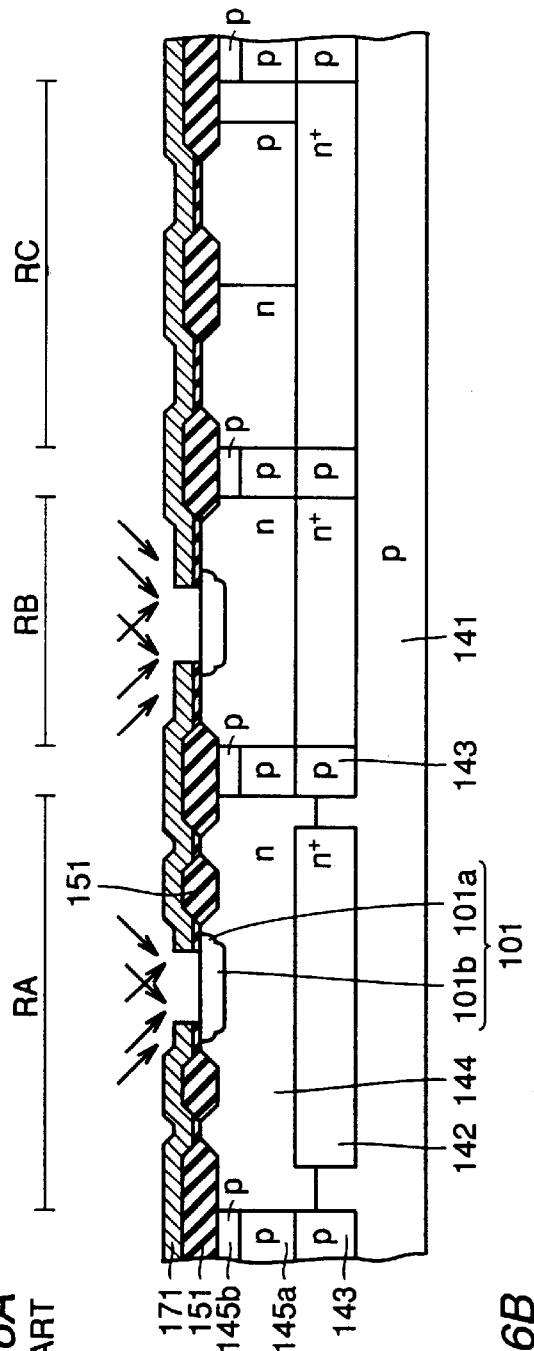
Figure 16B:
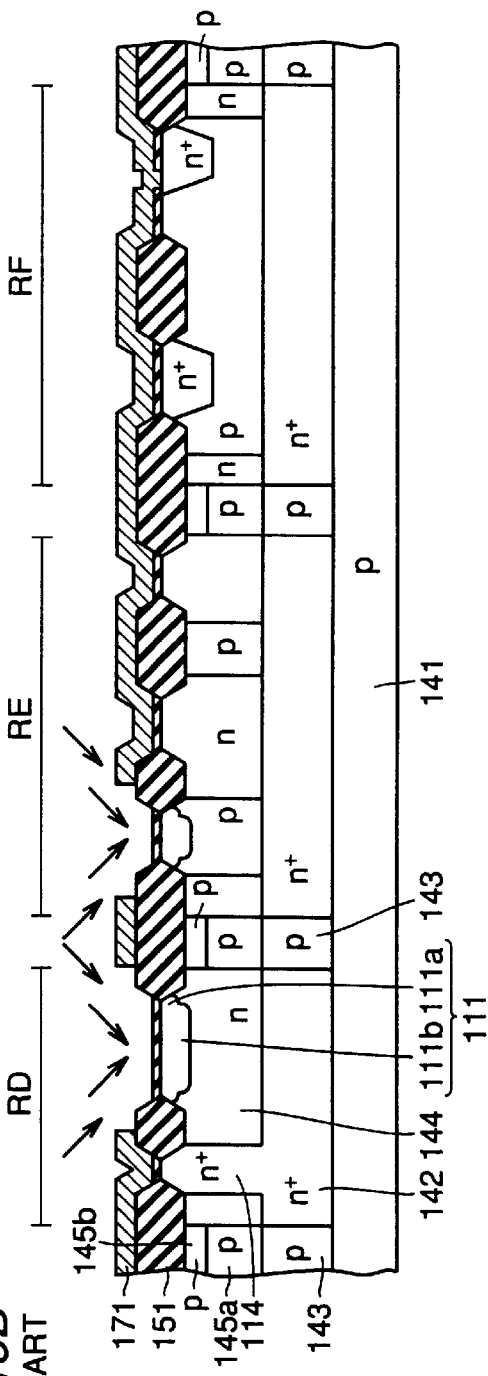
Figure 17:
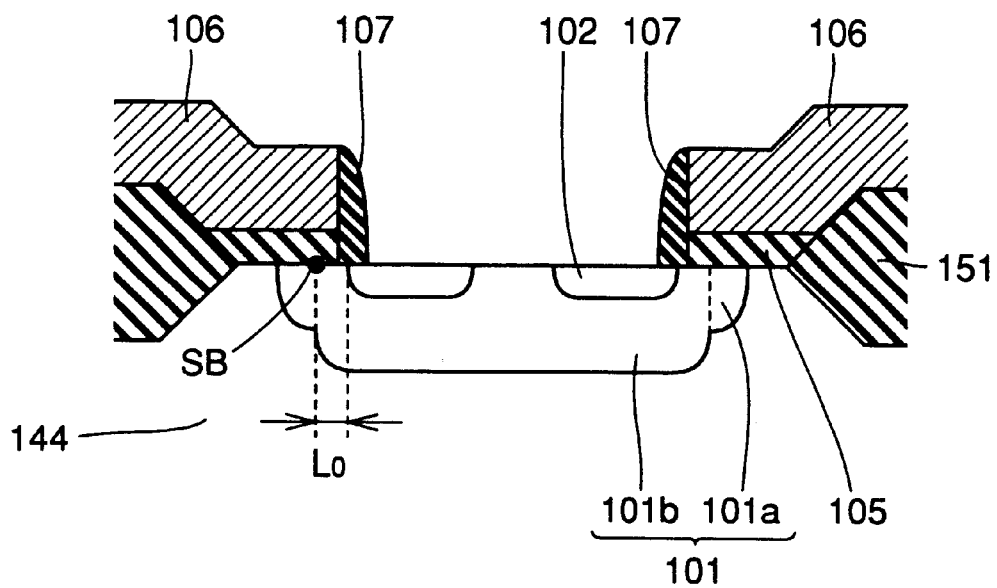
FIGS. 17 and 18 are enlarged views of regions R3 and R4 of FIG. 14, respectively.
Figure 18:
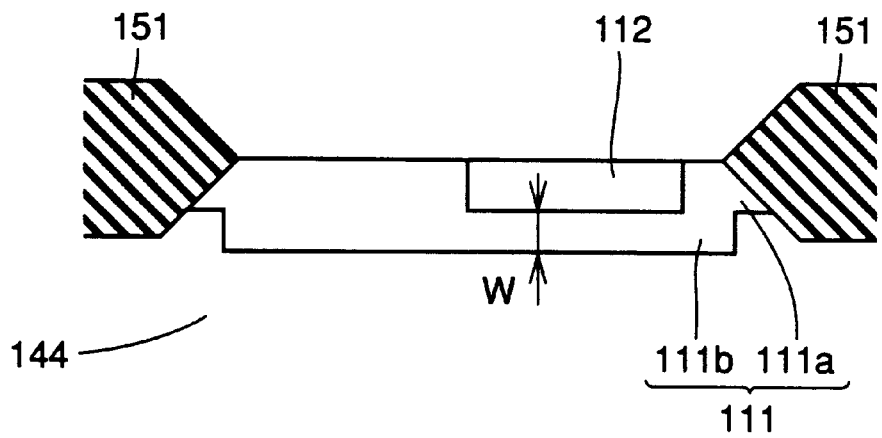

In a conventional example, as shown in FIG. 15, p type diffusion region 101b in the backgate region of DMOS transistor is formed before formation of a sidewall insulating layer for covering a respective sidewall of the gate electrode layer. As such, it laterally diffuses to the region directly beneath gate electrode layer 106, as shown in FIG. 13B, and therefore, the end portion SB of p type diffusion region 101b of backgate region 101 in the substrate surface is located directly beneath gate electrode layer 16.

In contrast, according to the manufacturing method of the present embodiment, p type diffusion region 1b of backgate region 1 is formed after formation of sidewall insulating layer 7, as shown in FIG. 8. Accordingly, end portion SA of p type diffusion region 1b in the substrate surface can be located at a region directly beneath sidewall insulating layer 7. In other words, end portion SA of p type diffusion region 1b in the substrate surface can be prevented from extending to the region underneath gate electrode layer 6.

Accordingly, when an n type source region is formed in p type backgate region 1, the overlapping length of p type diffusion regions 1a and 1b in the channel region at the substrate surface sandwiched between n type source region 2 and n type epitaxial region 44 can be shortened, or, such overlapping portion can even be eliminated. The threshold voltage Vth of DMOS transistor that is determined by concentration distribution in the channel region can thus be easily controlled solely by p type diffusion region 1a, and therefore, the control of the threshold voltage Vth is simplified.

If p type diffusion region 1b is formed of high concentration, diffusion length of p type diffusion region 1b increases, and so does the overlapping length of p type diffusion regions 1a and 1b in the channel region. According to the present embodiment, however, the overlapping length can be shortened compared to the conventional example, and therefore, such increase in diffusion length of p type diffusion region 1b makes little difference. P type diffusion region 1b can thus be formed of high concentration.

Consequently, p type diffusion region 11b of base region 11 that is formed at the same manufacturing step as this p type diffusion region 1b (see FIG. 8) can also be formed of high concentration. P type diffusion region 11b of base region 11 that is formed of such high concentration guarantees a large breakdown voltage of the bipolar transistor even when the diffusion depth of p type diffusion region 11b is shallow. As such, p type diffusion region 11b can be formed shallow, which in turn enables the so-called base width of bipolar transistor to be set small. Accordingly, it becomes easy to let the bipolar transistor operate at high speed.

Furthermore, since p type diffusion region 1b of backgate region 1 can be formed of high concentration, an extra p type diffusion region (not shown) formed in another region at the same manufacturing step as this p type diffusion region 1b can alternatively be used as a high-precision resistance.

The implantation of boron shown in FIG. 6 is conducted at energy no more than 80 keV at an angle between 45° and 60° with respect to the perpendicular of substrate surface. This is to guarantee sufficient concentration and diffusion length at the substrate surface that are necessary for accurate operation of the DMOS transistor. The implantation of boron shown in FIG. 8 is conducted at energy no more than 70 keV at an angle between 0° and 10° with respect to the perpendicular of the substrate surface. This is to form p type diffusion region 11b deeper than p type diffusion region 11a, and accordingly, to control hFE, BVceo and breakdown voltage of the npn bipolar transistor without adversely affecting the channel region of the DMOS transistor.

Although the present invention has been described and illustrated in detail, it is clearly understood that the same is by way of illustration and example only and is not to be taken by way of limitation. The spirit and scope of the present invention are limited only by the terms of the appended claims.

What is claimed is:

1. A semiconductor device including an insulated gate type field effect transistor, comprising:

a semiconductor substrate having a main surface and a region of a first conductivity type;

a gate electrode layer of said insulated gate type field effect transistor formed on the main surface of said semiconductor substrate with a gate insulating layer interposed therebetween;

a sidewall insulating layer formed to cover a sidewall of said gate electrode layer;

a first impurity region of a second conductivity type formed in said region of the first conductivity type, having a portion located at said main surface exposed from said gate electrode layer and said sidewall insulating layer, and having its end portion at said main surface extending to a region directly beneath said gate electrode layer;

a second impurity region of the second conductivity type, having a portion located at said main surface exposed from said gate electrode layer and said sidewall insulating layer, having its end portion at said main surface located directly beneath said sidewall insulating layer, and formed with a diffusion depth that is deeper from said main surface than said first impurity region and to have a portion overlapping said first impurity region;

a third impurity region of the first conductivity type, formed at said main surface within said first and second impurity regions to sandwich a portion of said first impurity region located directly beneath said gate electrode layer between said region of the first conductivity type and the third impurity region, and to become either one of source and drain regions of said insulated gate type field effect transistor; and a bipolar transistor having a base region;

said base region includes
a first base region of the second conductivity type formed of the same impurity type as and having the same diffusion depth as said first impurity region, and
a second base region of the second conductivity type formed of the same impurity type as and having the same diffusion depth as said second impurity region and having a portion overlapping said first base region.

2. The semiconductor device according to claim 1, further comprising:

an element separating insulating layer formed at said main surface of said semiconductor substrate;

wherein said gate electrode layer has its end portion overlaying said element separating insulating layer.

3. The semiconductor device according to claim 1, wherein said gate electrode layer includes a configuration in which a polycrystalline silicon layer doped with impurity and a silicide layer are stacked one on top of the other.

* * * * *